United States Patent
Ivanov et al.

(10) Patent No.: US 10,931,247 B2
(45) Date of Patent: Feb. 23, 2021

(54) CHOPPER AMPLIFIER

(71) Applicant: TEXAS INSTRUMENTS INCORPORATED, Dallas, TX (US)

(72) Inventors: Vadim Valerievich Ivanov, Tucson, AZ (US); Bharath Karthik Vasan, Tucson, AZ (US); Piyush Kaslikar, Tucson, AZ (US); Srinivas K. Pulijala, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 62 days.

(21) Appl. No.: 16/357,572

(22) Filed: Mar. 19, 2019

(65) Prior Publication Data

US 2020/0106409 A1 Apr. 2, 2020

Related U.S. Application Data

(60) Provisional application No. 62/737,945, filed on Sep. 28, 2018.

(51) Int. Cl.
*H03F 1/02* (2006.01)
*H03F 3/387* (2006.01)
*H03F 3/19* (2006.01)

(52) U.S. Cl.
CPC ............. *H03F 3/387* (2013.01); *H03F 3/19* (2013.01); *H03F 2200/168* (2013.01); *H03F 2200/375* (2013.01); *H03F 2200/459* (2013.01)

(58) Field of Classification Search
CPC ... H03F 1/08; H03F 1/14; H03F 3/005; H03F 3/45
USPC .............................. 330/9, 107, 109; 327/124
See application file for complete search history.

(56) References Cited

U.S. PATENT DOCUMENTS

| | | | |
|---|---|---|---|
| 7,292,095 B2 | 11/2007 | Burt et al. | |
| 7,518,440 B1* | 4/2009 | Trifonov | H03F 1/08 327/124 |
| 7,764,118 B2 | 7/2010 | Kusuda et al. | |
| 10,003,306 B1 | 6/2018 | Larson et al. | |
| 2014/0232456 A1* | 8/2014 | Huijsing | H03F 3/45071 330/9 |

* cited by examiner

*Primary Examiner* — Steven J Mottola
(74) *Attorney, Agent, or Firm* — John R. Pessetto; Charles A. Brill; Frank D. Cimino

(57) ABSTRACT

A chopper amplifier circuit includes a first amplifier path, a second amplifier path, and a third amplifier path. The first amplifier path includes chopper circuitry configured to modulate an input signal and an offset voltage at a chopping frequency, and ripple reduction circuitry configured to attenuate the chopping frequency in a signal in the first amplifier path. The second amplifier path includes a feedforward gain stage, and is configured to apply higher gain to intermediate signal frequencies than is applied in the first amplifier path. The third amplifier path includes a feedforward gain stage, and is configured to apply higher gain to high signal frequencies than is applied in the first amplifier path and the second amplifier path. The intermediate signal frequencies are lower than the high signal frequencies.

16 Claims, 5 Drawing Sheets

CHOPPER AMPLIFIER

RELATED APPLICATION

This application claims priority to U.S. Provisional Application No. 62/737,945 filed Sep. 28, 2018, which is hereby incorporated herein by reference.

BACKGROUND

Modern electronic systems involve different circuits and networks, where the voltage or current levels of signals conveyed along links between components or circuits are often adjusted. Signal amplifier circuits are one type of circuit that is used to adjust the voltage or current levels of signals along a link, where the goal of signal amplification is to increase signal strength without introducing errors like offset voltage, noise, distortion, etc. There are several different signal amplifier topologies, each suitable for different applications.

One signal amplifier topology is referred to as a chopper amplifier. A chopper amplifier is a type of amplifier that typically reduces offset voltage by using chopping techniques to convert offset voltage into a ripple signal at the chopping frequency. The amplitude of the ripple signal is proportional to the offset voltage.

SUMMARY

Chopper amplifier circuits that include multiple gain stages to attenuate chopper ripple are disclosed herein. In one example, a chopper amplifier circuit includes a first amplifier path and a second amplifier path. The first amplifier path includes chopper circuitry, a first gain stage, a second gain stage, a third gain stage, a fourth gain stage, and ripple reduction circuitry. The chopper circuitry is configured to modulate an input signal and an offset voltage at a chopping frequency. The first gain stage is coupled to the chopper circuitry. The second gain stage is coupled to the first gain stage. The third gain stage is coupled to the second gain stage. The fourth gain stage is coupled to the third gain stage. The ripple reduction circuitry is configured to attenuate the chopping frequency in a signal in the first amplifier path. The second amplifier path includes a feedforward gain stage, and is configured to apply higher gain to high signal frequencies than is applied to the high signal frequencies in the first amplifier path. The chopping frequency applied in the chopper circuitry is within a frequency band of the high frequency signals, and is higher than a signal frequency to which unity gain is applied in the first amplifier path.

In another example, a chopper amplifier circuit includes a first amplifier path, a second amplifier path, and a third amplifier path. The first amplifier path includes chopper circuitry configured to modulate an input signal and an offset voltage at a chopping frequency, and ripple reduction circuitry configured to attenuate the chopping frequency in a signal in the first amplifier path. The second amplifier path includes a feedforward gain stage, and is configured to apply higher gain to intermediate signal frequencies than is applied in the first amplifier path. The third amplifier path includes a feedforward gain stage, and is configured to apply higher gain to high signal frequencies than is applied in the first amplifier path and the second amplifier path. The intermediate signal frequencies are lower than the high signal frequencies.

In a further example, a method for reducing chopper ripple in a chopper amplifier includes modulating, by chopper circuitry, an input signal at a chopping frequency to produce a modulated signal. The modulated signal is amplified, by a low frequency amplifier path, to produce an amplified modulated signal. The amplified modulated signal is demodulated, by the low frequency amplifier path, to produce a demodulated signal, and an offset voltage is modulated to the chopping frequency. An intermediate frequency band of the input signal is amplified, by an intermediate frequency amplifier path that bypasses at least a portion of the low frequency signal path. A high frequency band of the input signal is amplified, by a high frequency amplifier path that bypasses at least a portion of the low frequency signal path and at least a portion of the intermediate frequency signal path. The chopping frequency is filtered, by a gain stage of the intermediate frequency amplifier path and a gain stage of the high frequency amplifier, from the demodulated signal. The chopping frequency is at a frequency at which the high frequency amplifier path provides higher gain than the intermediate frequency amplifier path and the low frequency amplifier path.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Chopper amplifiers shift input stage offset voltage up to a chopping frequency applied to operate the amplifier's chopping circuitry. While providing greatly reduced offset voltage, the chopping produces ripple (chopper ripple) at the chopping frequency in the amplifier output signal. Chopper ripple can significantly limit system dynamic range. Some chopper amplifiers include a synchronous switched capacitor notch filter to reduce chopper ripple. Other chopper amplifiers include a feedback loop across the output chopper switches (the demodulator chopper switches) to reduce chopper ripple.

The chopper amplifier circuits disclosed herein provide chopper ripple attenuation that can exceed that provided by the synchronous notch filter or feedback circuit alone. The chopper amplifier circuits of the present disclosure include a multi-gain stage architecture and multiple bypass amplification paths. The amplifiers include a low frequency amplifier path which contains chopping, an intermediate frequency amplifier path, and a high frequency amplifier path. The addition of the intermediate frequency path to the chopper amplifiers allows for better attenuation of chopper ripple. The chopping frequency is set to a frequency at which the high frequency application path provides higher gain than the intermediate frequency amplification path and the low frequency amplification path.

Figure 1:
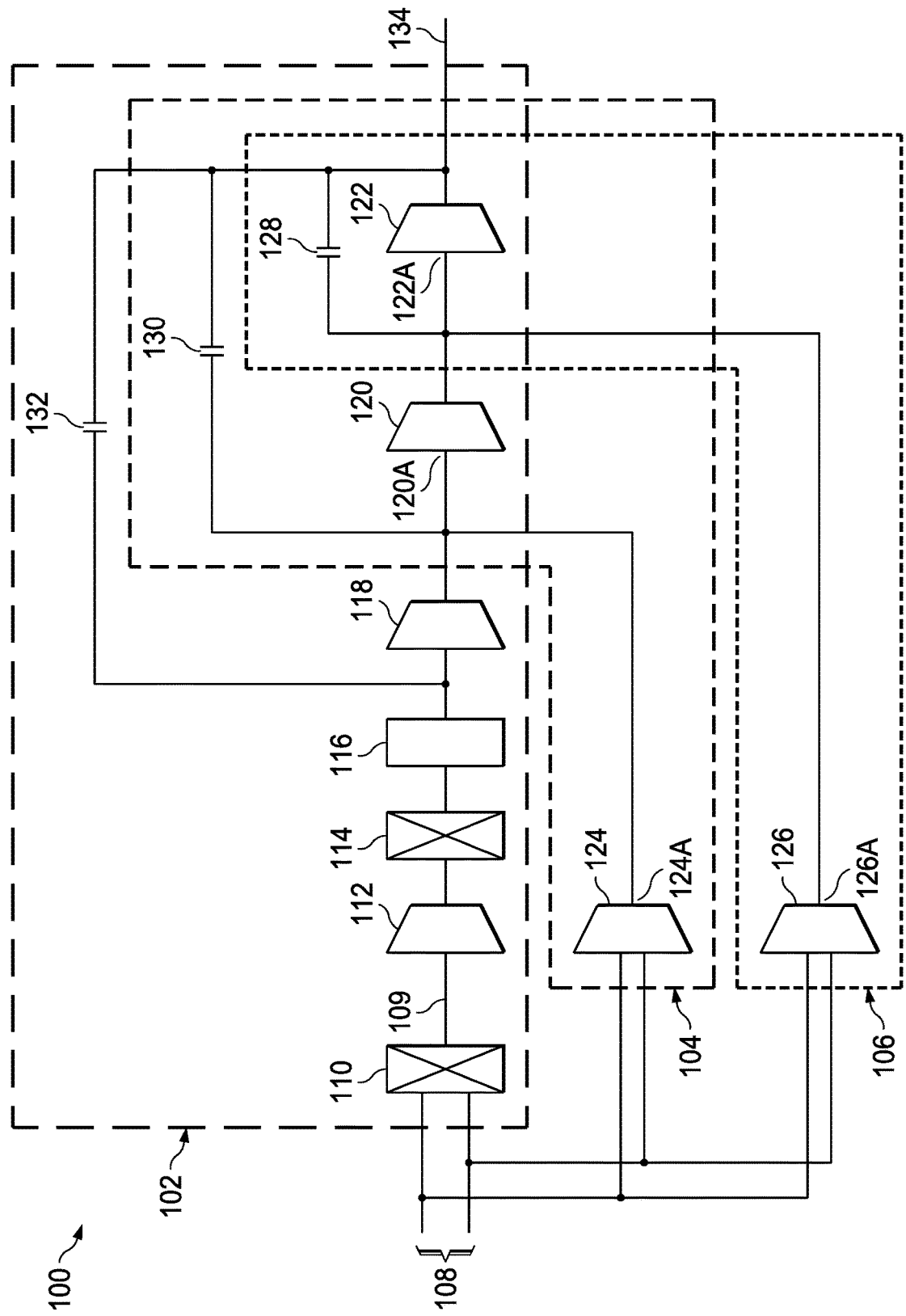
FIG. 1 shows a block diagram for an example chopper amplifier in accordance with the present disclosure.

FIG. 1 shows a block diagram for an example chopper amplifier 100 in accordance with the present disclosure. The chopper amplifier 100 includes a low frequency amplifier path 102, an intermediate frequency amplifier path 104, and a high frequency amplifier path 106. The low frequency amplifier path 102 includes chopper switches 110, a first gain stage 112, chopper switches 114, a chopper ripple filter 116, a second gain stage 118, a third gain stage 120, a fourth gain stage 122, and a compensation capacitor 132. The first gain stage 112 is coupled to the chopper switches 110. The chopper switches 114 are coupled to the first gain stage 112. The second gain stage 118 is coupled to the first gain stage 112 via the chopper switches 114. The third gain stage 120 is coupled to the second gain stage 118. The fourth gain stage 122 is coupled to the third gain stage 120.

The intermediate frequency amplifier path 104 includes a feedforward gain stage 124, the third gain stage 120, the fourth gain stage 122, and a compensation capacitor 130. The high frequency amplifier path 106 includes a feedforward gain stage 126, the fourth gain stage 122, and a compensation capacitor 128. In some implementations of the chopper amplifier 100, the first gain stage 112, the second gain stage 118, the third gain stage 120, the fourth gain stage 122, the feedforward amplifier 124, and/or the feedforward amplifier 126 are implemented with transconductance amplifiers.

The chopper switches 110 includes a plurality of switches that sample the differential input signal 108 at a predetermined chopping frequency. The chopping frequency is the frequency at which switches of the chopper switches 110 are opened and closed. The sampling performed by the chopper switches 110 modulates the differential input signal 108 at the chopping frequency. The samples of the differential input signal 108 produced by operation of the chopper switches 110 are amplified by the first gain stage 112. The amplified samples of the differential input signal 108 generated by the first gain stage 112, and the offset voltage of the first gain stage 112, are provided to the chopper switches 114. The chopper switches 114 includes a plurality of switches that demodulate the signal received from the first gain stage 112. The demodulation shifts the offset voltage of the first gain stage 112 to the chopping frequency, thereby producing chopper ripple in the signal output of the chopper switches 114.

The signal output of the chopper switches 114 is provided to the chopper ripple filter 116. The chopper ripple filter 116 attenuates (reduces the amplitude of) the chopper ripple at the output of the chopper switches 114. The chopper ripple filter 116 is implemented in variety of different ways as further disclosed herein. The signal output of the chopper switches 114 is amplified in the second gain stage 118, the third gain stage 120, and the fourth gain stage 122. The compensation capacitor 132 couples the output of the fourth gain stage 122 to the input of the second gain stage 118.

The intermediate frequency amplifier path 104 is a bypass path that provides higher gain to intermediate frequencies of the differential input signal 108 (frequencies higher than the frequencies passed via the low frequency amplifier path 102 and lower than the frequencies passed via the high frequency amplifier path 106) than is provided by the low frequency amplifier path 102, and allows the intermediate frequencies to circumvent the chopper switches 110, the first gain stage 112, the chopper switches 114, the chopper ripple filter 116, and the second gain stage 118. The feedforward gain stage 124 receives and amplifies the differential input signal 108. The feedforward gain stage 124 is coupled to, and provides an amplified output signal containing intermediate frequencies of the differential input signal 108 to, the third gain stage 120, and the signal is further amplified by the third gain stage 120 and the fourth gain stage 122. The compensation capacitor 130 couples the output of the fourth gain stage 122 to the input of the third gain stage 120.

The high frequency amplifier path 106 is a bypass path that provides higher gain to high frequencies of the differential input signal 108 (frequencies higher than the frequencies passed via the low frequency amplifier path 102 or the intermediate frequency amplifier path 104), and allows the high frequencies to circumvent the chopper switches 110, the first gain stage 112, the chopper switches 114, the chopper ripple filter 116, the second gain stage 118, and the third gain stage 120. The feedforward gain stage 126 receives and amplifies the differential input signal 108. The feedforward gain stage 126 is coupled to, and provides an amplified output signal containing high frequencies of the differential input signal 108 to the fourth gain stage 122, and the signal is further amplified by the fourth gain stage 122. The compensation capacitor 128 couples the output of the fourth gain stage 122 to the input of the fourth gain stage 122.

Figure 2:
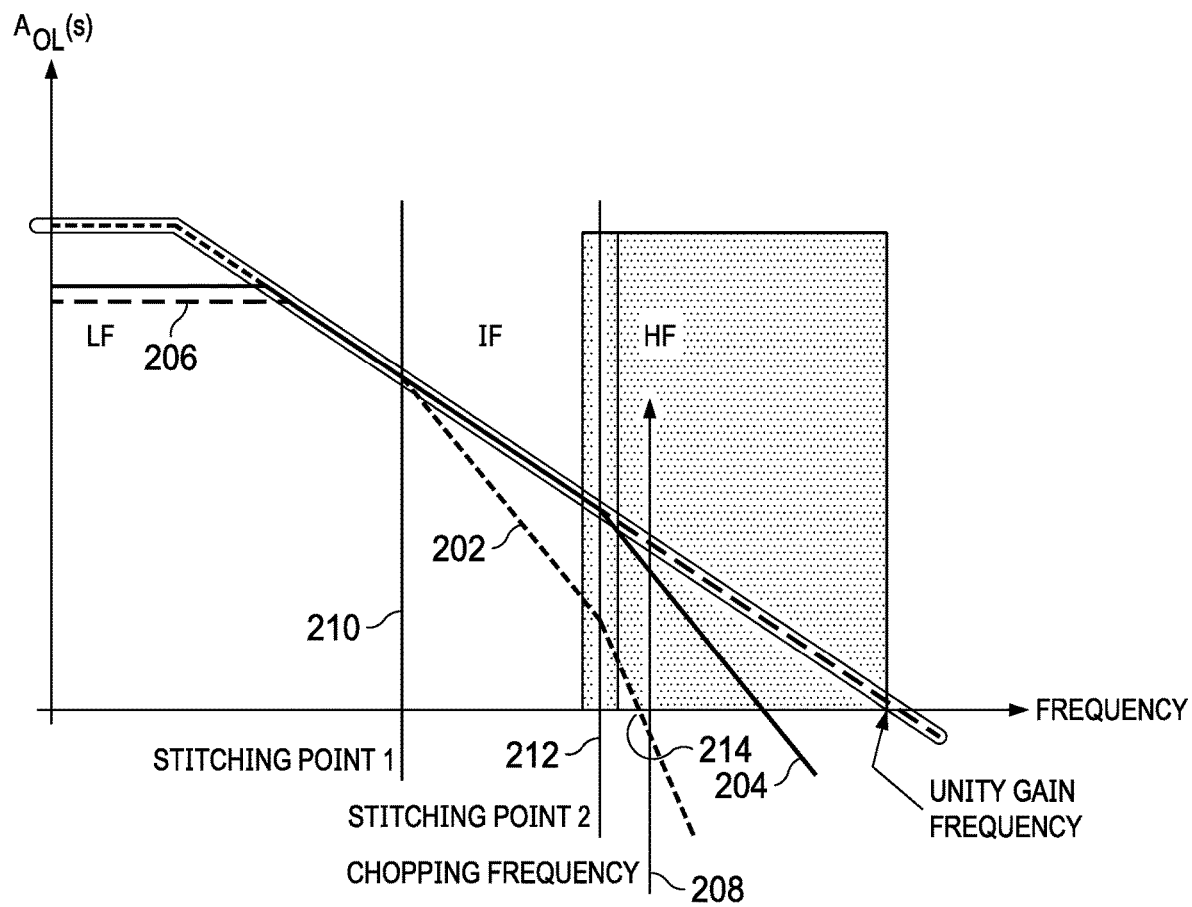
FIG. 2 shows example gains of the low, intermediate, and high frequency amplifier paths of a chopper amplifier in accordance with the present disclosure.

FIG. 2 shows an example of gain versus frequency for the chopper amplifier 100. In FIG. 2, the first stitching point 210 is the frequency at which gain in the intermediate frequency amplifier path 104 exceeds the gain in the low frequency amplifier path 102. The second stitching point 212 is the frequency at which gain in the high frequency amplifier path 106 exceeds gain in the intermediate frequency amplifier path 104. In the chopper amplifier 100, the chopping frequency 208 is higher than the first stitching point 210 and the second stitching point 212. For example, the chopping frequency 208 is higher than a frequency 214 to which gain is applied in the first amplifier path 102. Because the second stitching point 212 is lower than the chopping frequency 208, the chopper ripple is attenuated by an additional gain stage in the chopper amplifier 100. Moreover, because the second stitching point 212 and the first stitching point 210 are lower than chopping frequency, delay in the chopper ripple filter 116 does not affect the phase response (and the stability) of the chopper amplifier 100, which allows the chopper amplifier 100 to realize high gain bandwidth.

While the chopper amplifier 100 is illustrated as including the third gain stage 120 in the intermediate frequency amplifier path 104, and the fourth gain stage 122 in the high frequency amplifier path 106, some implementations of the 100 include more than one gain stage in the intermediate frequency amplifier path 104 and/or the high frequency amplifier path 106. Such implementations of the chopper amplifier 100 include more than two stitching points and, in some such implementations, each of the stitching points is lower than the chopping frequency to increase the attenuation of chopper ripple. For example, an implementation of the chopping amplifier 100 includes five gain stages in the low frequency amplifier path 102, where two of the gain stages are included in the intermediate frequency amplifier path 104, and one of the gain stages is included in the high frequency amplifier path 106. If all three of the associated stitching points are lower than the chopping frequency, then chopper ripple is attenuated by three gain stages.

Figure 3:
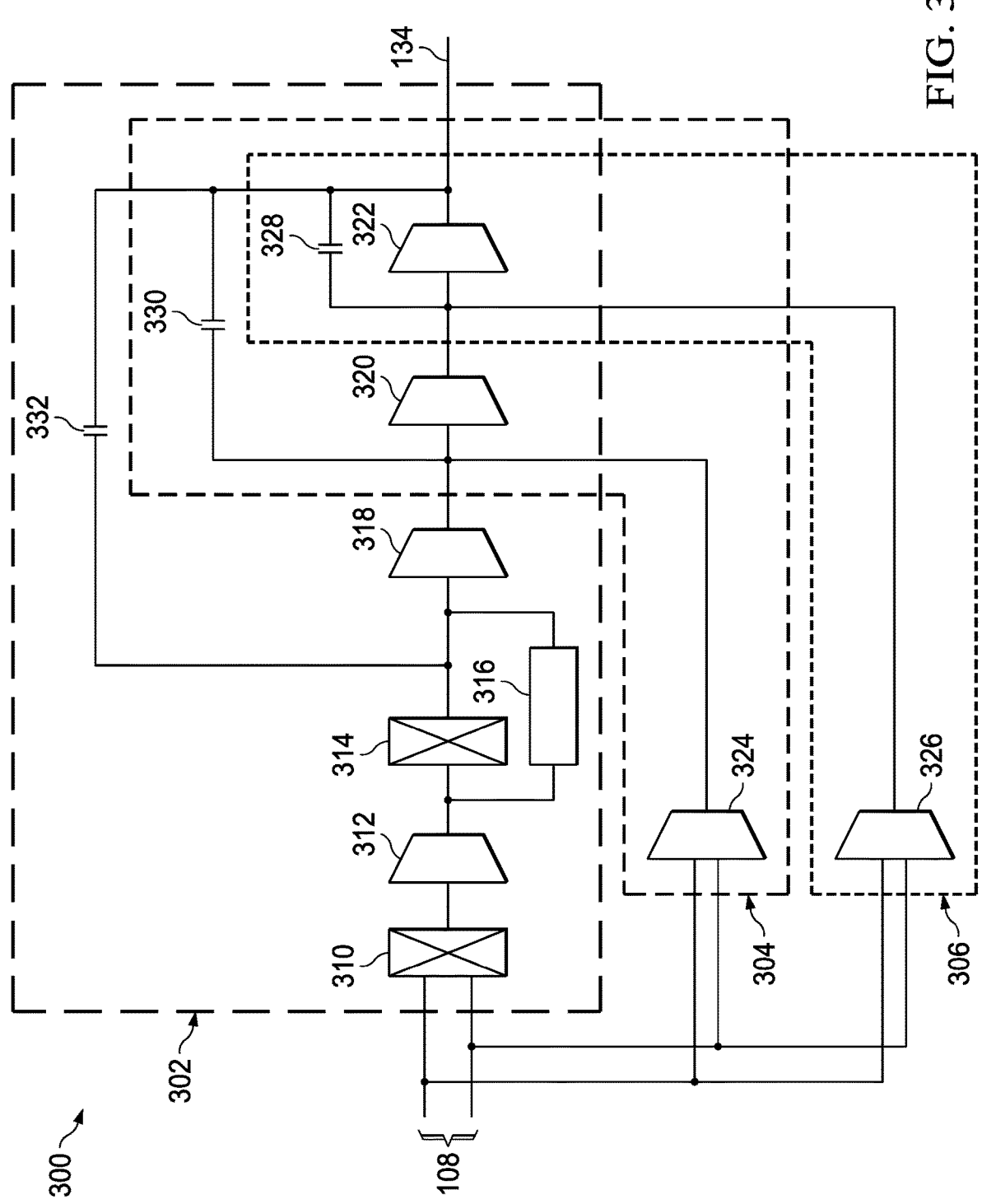
FIG. 3 shows a block diagram for another example chopper amplifier in accordance with the present disclosure.

FIG. 3 shows a block diagram for another example chopper amplifier 300 in accordance with the present disclosure. The chopper amplifier 300 is an implementation of the chopper amplifier 100. The chopper amplifier 300 includes a low frequency amplifier path 302, an intermediate frequency amplifier path 304, and a high frequency amplifier path 306. The low frequency amplifier path 302 includes chopper switches 310, a first gain stage 312, chopper switches 314, a chopper ripple feedback circuit 316, a second gain stage 318, a third gain stage 320, a fourth gain stage 322, and a compensation capacitor 332. The intermediate frequency amplifier path 304 includes a feedforward gain stage 324, the third gain stage 320, the fourth gain stage 322, and a compensation capacitor 330. The high frequency amplifier path 306 includes a feedforward gain stage 326, the fourth gain stage 322, and a compensation capacitor 328. In some implementations of the chopper amplifier 300, the first gain stage 312, the second gain stage 318, the third gain stage 320, the fourth gain stage 322, the feedforward amplifier 324, and/or the feedforward amplifier 326 are implemented with transconductance amplifiers.

The chopper switches 310 includes a plurality of switches that sample the differential input signal differential input signal 108 at a predetermined chopping frequency. The sampling performed by the chopper switches 310 modulates the differential input signal 108 at the chopping frequency. The samples of the differential input signal 108 produced by operation of the chopper switches 310 are amplified by the first gain stage 312. The amplified samples of the differential input signal 108 generated by the first gain stage 312, and the offset voltage of the first gain stage 312, are provided to the chopper switches 314. The chopper switches 314 includes a plurality of switches that demodulate the signal received from the first gain stage 312. The demodulation shifts the offset voltage of the first gain stage 312 to the chopping frequency, thereby producing chopper ripple in the signal output of the chopper switches 314.

The signal output of the chopper switches 314 is provided to the chopper ripple feedback circuit 316. The chopper ripple feedback circuit 316 demodulates the chopper ripple and generates a compensation current that is fed back to the input of the chopper switches 314 to cancel the offset voltage of the first gain stage 312. The signal output of the chopper switches 314 is further amplified in the second gain stage 318, the third gain stage 320, and the fourth gain stage 322. The compensation capacitor 332 couples the output of the fourth gain stage 322 to the input of the chopper ripple feedback circuit 316.

The intermediate frequency amplifier path 304 is a bypass path that provides higher gain to intermediate frequencies of the differential input signal 108 (frequencies higher than the frequencies passed via the low frequency amplifier path 302 and lower than the frequencies passed via the high frequency amplifier path 306) than is provided by the low frequency amplifier path 302, and allows the intermediate frequencies to circumvent the chopper switches 310, the first gain stage 312, the chopper switches 314, the chopper ripple filter 316, and the second gain stage 318. The feedforward gain stage 324 receives and amplifies the differential input signal 108. The feedforward gain stage 324 is coupled to, and provides an amplified output signal containing intermediate frequencies of the differential input signal 108 to, the third gain stage 320, and the signal is further amplified by the third gain stage 320 and the fourth gain stage 322. The compensation capacitor 330 couples the output of the fourth gain stage 322 to the input of the third gain stage 320.

The high frequency amplifier path 306 is a bypass path that provides higher gain to high frequencies of the differential input signal 108 (frequencies higher than the frequencies passed via the low frequency amplifier path 302 or the intermediate frequency amplifier path 304), and allows the high frequencies to circumvent the chopper switches 310, the first gain stage 312, the chopper switches 314, the chopper ripple filter 316, the second gain stage 318, and the third gain stage 320. The feedforward gain stage 326 receives and amplifies the differential input signal 108. The feedforward gain stage 326 is coupled to, and provides an amplified output signal containing high frequencies of the differential input signal 108 to the fourth gain stage 322, and the signal is further amplified by the fourth gain stage 322. The compensation capacitor 328 couples the output of the fourth gain stage 322 to the input of the fourth gain stage 322.

Figure 4:
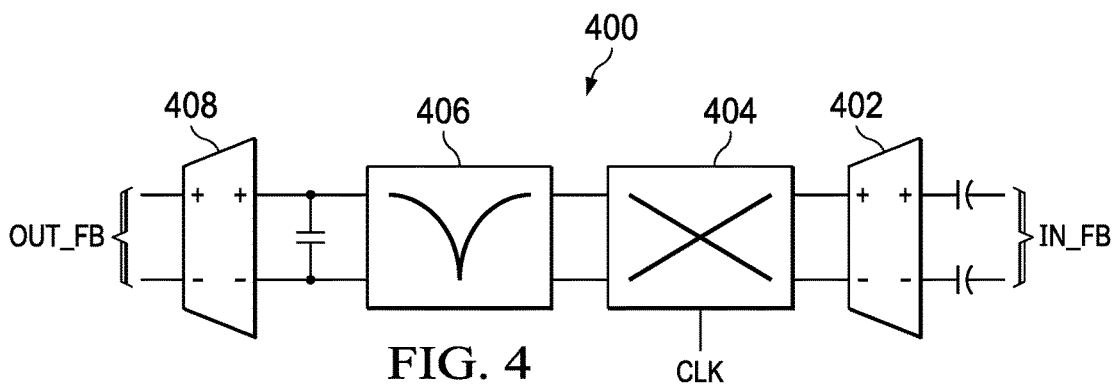
FIG. 4 shows a block diagram for example ripple reduction feedback circuitry suitable for use in the chopper amplifier of FIG. 3.

FIG. 4 shows a block diagram for example ripple reduction feedback circuitry 400. The ripple reduction feedback circuitry 400 is an implementation of the chopper ripple feedback circuit 316. The ripple reduction feedback circuitry 400 includes a gain stage 402, chopper switches 404, a filter 406, and a gain stage 408. The gain stage 402 and/or the gain stage 408 may be implemented as transconductance amplifiers. The gain stage 402 receives the output signal of the chopper switches 314 and provides an output signal to the chopper switches 404. The chopper switches 404 includes a plurality of switches that demodulate the chopper ripple (and modulate the demodulated signal output of the chopper switches 314). The demodulated chopper ripple represents the offset voltage of the first gain stage 312. The filter 406 attenuates the portion of the output signal of the chopper switches 314 that is modulated (and shifted to the chopping frequency) by the chopper switches 404. The gain stage 408 drives the output of the filter 406, which consists primarily of the demodulated offset voltage produced by the chopper switches 404, to the input of the chopper switches 314 to compensate for the offset voltage of the first gain stage 312. In various embodiments, the filter 406 is a notch filter centered at the chopper frequency or a low pass filter.

Figure 5:
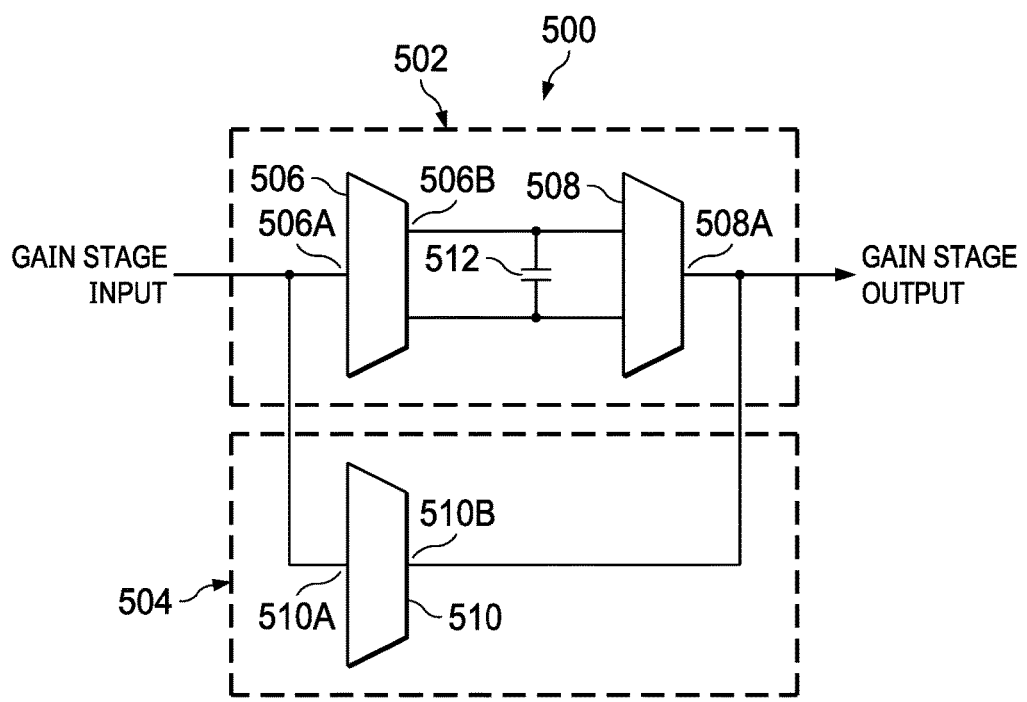
FIG. 5 shows an example gain stage for use in implementations of a chopper amplifier in accordance with the present disclosure.

FIG. 5 shows an example gain stage 500 for use in implementations of a chopper amplifier in accordance with the present disclosure. In various examples of a chopper amplifier 100 or the chopper amplifier 300, the gain stage 500 is an implementation of the second gain stage 118 or the second gain stage 318. The gain stage 500 includes a first amplifier path 502 and a second amplifier path 504. The first amplifier path 502 includes a gain sub-stage 506, a gain sub-stage 508 coupled to and cascaded with the gain sub-stage 506, and a capacitor 512 between the gain sub-stage 506 and the gain sub-stage 508. The second amplifier path 504 include a feedforward gain sub-stage 510. An input of the feedforward gain sub-stage 510 is coupled to an input of the gain sub-stage 506, and an output of the feedforward gain sub-stage 510 is coupled to an output of the gain sub-stage 508. In some implementations of the gain stage 500, the gain of the first amplifier path 502 is higher than the gain of the second amplifier path 504. The first amplifier path 502 applies to frequencies below a threshold frequency, while the second amplifier path 504 applies to frequencies above the threshold frequency. Application of the gain stage 500 further attenuates offset voltage and 1/f noise contributed by the feedforward gain stages of the intermediate frequency amplifier path 104 and high frequency amplifier path 106 (or intermediate frequency amplifier path 304 and high frequency amplifier path 306).

Figure 6:
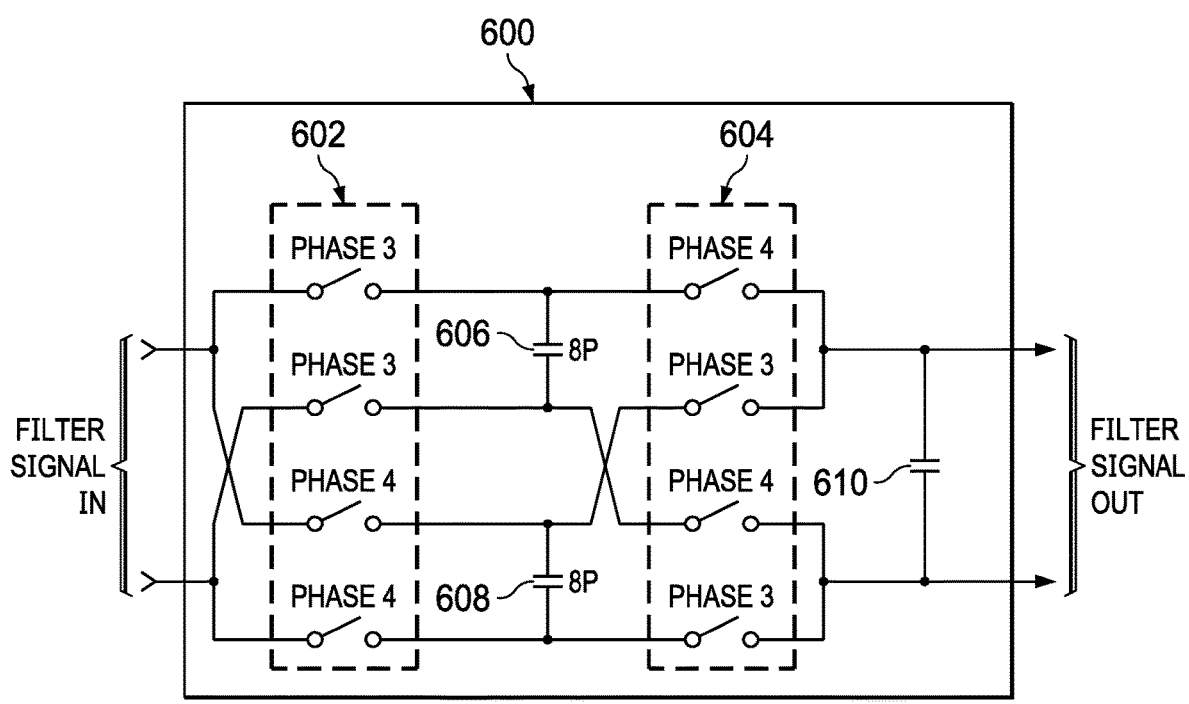
FIG. 6 shows an example synchronous switched capacitor notch suitable for use in a chopper amplifier in accordance with the present disclosure.

FIG. 6 shows an example synchronous switched capacitor notch filter 600 suitable for use in reducing chopper ripple in a chopper amplifier in accordance with the present disclosure. The synchronous switched capacitor notch filter 600 is an implementation of the chopper ripple filter 116. The synchronous switched capacitor notch filter 600 includes switches 602, switches 604, capacitor 606, capacitor 608, and capacitor 610. The switches 602 and 604 are operated by chopping frequency signals referred to in FIG. 6 as PHASE 3 and PHASE 4 that are complementary and offset in phase from the signal applied to operate the chopper switches 110 and chopper switches 114 by 90 degrees. Operation of the synchronous switched capacitor notch filter 600 produces a stop band (a null) frequency at the chopping frequency to attenuate the chopper ripple.

Figure 7:
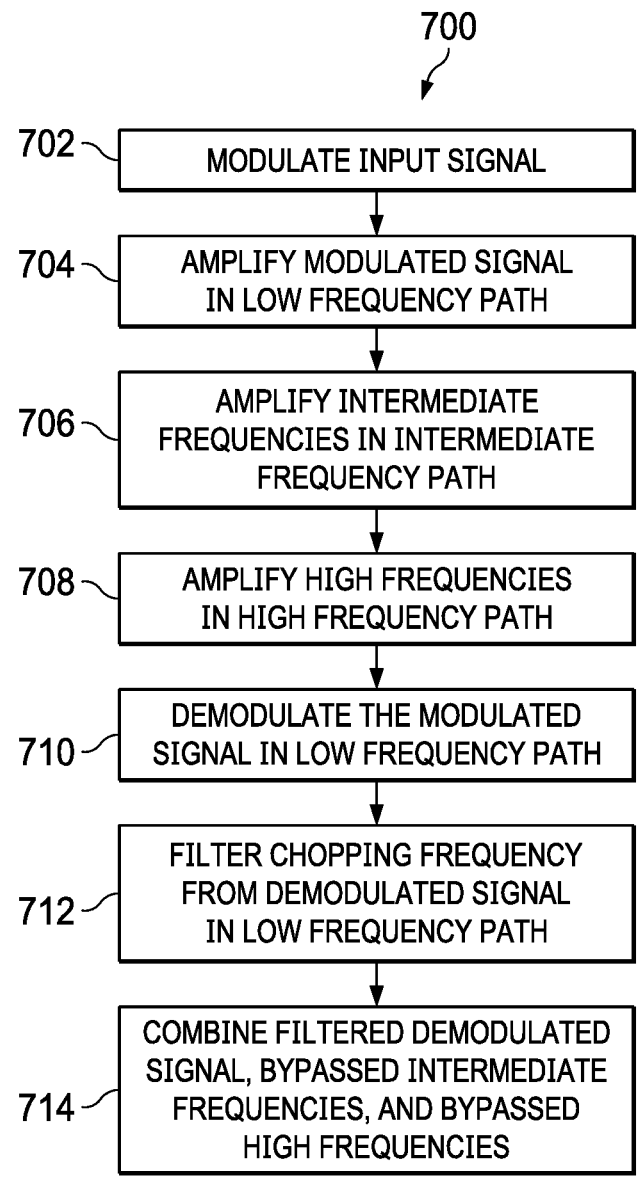
FIG. 7 shows a flow diagram for an example method for reducing chopper ripple in a chopper amplifier in accordance with the present disclosure.

FIG. 7 shows a flow diagram for an example method 700 for reducing chopper ripple in a chopper amplifier in accordance with the present disclosure. Though depicted sequentially as a matter of convenience, at least some of the actions shown can be performed in a different order and/or performed in parallel. Additionally, some implementations may perform only some of the actions shown. While operations of the method 700 are described with reference to the chopper amplifier 100, operations of the method 700 are applicable to implementations of the chopper amplifier 100 or the chopper amplifier 300.

In block 702, the chopper switches 110 modulate the differential input signal 108 at a chopper frequency to produce a modulated signal 109. The modulation is performed by opening and closing switches of the chopper switches 110 based on complementary switch control signals at the chopping frequency.

In block 704, the modulated signal 109 is amplified in the low frequency amplifier path 102. For example, the modulated signal 109 is amplified by the first gain stage 112. The modulated signal 109 is amplified in at least four gain stages in some implementations.

In block 706, intermediate frequencies of the differential input signal 108 are amplified in the intermediate frequency amplifier path 104. The intermediate frequencies of the differential input signal 108 bypass at least a portion of the low frequency amplifier path 102 via the intermediate frequency amplifier path 104. The differential input signal 108 is amplified in at least three gain stages of the intermediate frequency amplifier path 104 in some implementations.

In block 708, high frequencies of the differential input signal 108 are amplified in the high frequency amplifier path 106. The high frequencies of the differential input signal 108 bypass at least a portion of the low frequency amplifier path 102 and the intermediate frequency amplifier path 104 via the high frequency amplifier path 106. The differential input signal 108 is amplified in at least two gain stages of the high frequency amplifier path 106 in some implementations.

In block 710, the amplified modulated signal is demodulated in the low frequency amplifier path 102. For example, the switches of the chopper switches 114 are operated to demodulate the amplified modulated signal, and modulate offset voltage of the first gain stage 112 at the chopping frequency.

In block 712, the chopping frequency is filtered from signal in the low frequency amplifier path 102. For example, the synchronous switched capacitor notch filter 600 filters the chopping frequency from the demodulated output signal generated by the chopper switches 114, or the ripple reduction feedback circuitry 400 compensates for the offset voltage of the gain stage 112.

In block 714, the filtered demodulated signal, the intermediate frequencies processed in the intermediate frequency amplifier path 104, and the high frequencies processed in the high frequency amplifier path 106 are combined to form an output signal 134 of the chopper amplifier 100.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A chopper amplifier circuit, comprising:
    a first amplifier path, comprising:
        chopper circuitry configured to modulate an input signal and an offset voltage at a chopping frequency;
        a first gain stage coupled to the chopper circuitry;
        a second gain stage coupled to the first gain stage;
        a third gain stage coupled to the second gain stage;
        a fourth gain stage coupled to the third gain stage; and
        ripple reduction circuitry configured to attenuate the chopping frequency in a signal in the first amplifier path;
    a second amplifier path comprising a feedforward gain stage, and configured to apply higher gain to high signal frequencies than is applied to the high signal frequencies in the first amplifier path;
    wherein the chopping frequency applied in the chopper circuitry is:
        within a frequency band of the high frequency signals; and
    higher than a signal frequency to which unity gain is applied in the first amplifier path;
    further comprising a third amplifier path including a feedforward gain stage, and configured to:
    apply higher gain to intermediate frequency signals than is applied to the intermediate frequency signals in the first amplifier path; and
    apply lower gain to the high frequency signals than is applied in the second amplifier path.

2. The chopper amplifier circuit of claim 1, wherein an output of the feedforward gain stage of the third amplifier path is coupled to an input of the third gain stage of the first amplifier path.

3. The chopper amplifier of claim 1, wherein the chopping frequency is higher than a first frequency at which a gain applied at the first frequency in the second amplifier path is higher than gain applied at the first frequency in the third amplifier path.

4. A chopper amplifier circuit, comprising:
    a first amplifier path, comprising:
        chopper circuitry configured to modulate an input signal and an offset voltage at a chopping frequency;

a first gain stage coupled to the chopper circuitry;
a second gain stage coupled to the first gain stage;
a third gain stage coupled to the second gain stage;
a fourth gain stage coupled to the third gain stage; and
ripple reduction circuitry configured to attenuate the chopping frequency in a signal in the first amplifier path;
a second amplifier path comprising a feedforward gain stage, and configured to apply higher gain to high signal frequencies than is applied to the high signal frequencies in the first amplifier path;
wherein the chopping frequency applied in the chopper circuitry is:
within a frequency band of the high frequency signals; and
higher than a signal frequency to which unity gain is applied in the first amplifier path;
wherein the second gain stage comprises:
a first gain sub-stage; s
a second gain sub-stage coupled to the first gain sub-stage;
capacitor coupled to an output of the first gain sub-stage; and
a feedforward gain sub-stage comprising:
an input coupled to an input of the first gain sub-stage; and
an output coupled to an output of the second gain sub-stage.

5. A chopper amplifier circuit, comprising:
a first amplifier path, comprising:
chopper circuitry configured to modulate an input signal and an offset voltage at a chopping frequency; and
ripple reduction circuitry configured to attenuate the chopping frequency in a signal in the first amplifier path;
a second amplifier path comprising a feedforward gain stage, and configured to apply higher gain to intermediate signal frequencies than is applied in the first amplifier path; and
a third amplifier path comprising a feedforward gain stage, and configured to apply higher gain to high signal frequencies than is applied in the first amplifier path and the second amplifier path;
wherein the intermediate signal frequencies are lower than the high signal frequencies.

6. The chopper amplifier circuit of claim 5, wherein the first amplifier path comprises
a first gain stage coupled to the chopper circuitry;
a second gain stage coupled to the first gain stage;
a third gain stage coupled to the second gain stage; and
a fourth gain stage coupled to the third gain stage.

7. The chopper amplifier of claim 6, wherein the second gain stage comprises:
a first gain sub-stage;
a second gain sub-stage coupled to the first gain sub-stage;
capacitor coupled to an output of the first gain sub-stage; and
a feedforward gain stage comprising:
an input coupled to an input of the first gain sub-stage; and
an output coupled to an output of the second gain sub-stage.

8. The chopper amplifier circuit of claim 6, wherein:
an output of the feedforward gain stage of the second amplifier path is coupled to an input of the third gain stage of the first amplifier path; and
an output of the feedforward gain stage of the third amplifier path is coupled to an input of the fourth gain stage of the first amplifier path.

9. The chopper amplifier of claim 5, wherein the chopping frequency applied in the chopper circuitry is higher than a first frequency at which a gain applied at the first frequency in the third amplifier path is higher than gain applied at the first frequency in the second amplifier path.

10. The chopper amplifier of claim 5, wherein the chopping frequency is higher than a first frequency at which unity gain is applied in the first amplifier path.

11. The chopper amplifier circuit of claim 5, wherein the ripple reduction circuitry comprises a notch filter having a stop band frequency at the chopping frequency.

12. The chopper amplifier circuit of claim 5, wherein the ripple reduction circuitry comprises a feedback circuit disposed across switches coupling the first gain stage to the second gain stage.

13. A method for reducing chopper ripple in a chopper amplifier, comprising:
modulating, by chopper circuitry, an input signal at a chopping frequency to produce a modulated signal;
amplifying, by a low frequency amplifier path, the modulated signal to produce an amplified modulated signal;
demodulating, by the low frequency amplifier path, the amplified modulated signal to produce a demodulated signal;
amplifying, by an intermediate frequency amplifier path that bypasses at least a portion of the low frequency signal path, an intermediate frequency band of the input signal;
amplifying, by a high frequency amplifier path that bypasses at least a portion of the low frequency signal path and at least a portion of the intermediate frequency signal path, a high frequency band of the input signal;
filtering, by a gain stage of the intermediate frequency amplifier path and a gain stage of the high frequency amplifier, the chopping frequency from the demodulated signal; wherein the chopping frequency is at a frequency at which the high frequency amplifier path provides higher gain than the intermediate frequency amplifier path and the low frequency amplifier path.

14. The method of claim 13, further comprising amplifying, by the low frequency amplifier path, the input signal in at least four gain stages.

15. The method of claim 13, further comprising amplifying, by the intermediate frequency amplifier path, the input signal in at least three gain stages.

16. The method of claim 13, further comprising amplifying, by the high frequency amplifier path, the input signal in at least two gain stages.

* * * * *